(12) United States Patent
Qu et al.

(10) Patent No.: US 9,543,904 B1
(45) Date of Patent: Jan. 10, 2017

(54) DIFFERENTIAL AMPLIFIER CIRCUIT AND SEMICONDUCTOR MEMORY DEVICE INCLUDING SAME

(71) Applicant: SK hynix Inc., Gyeonggi-do (KR)

(72) Inventors: Han Qu, Gyeonggi-do (KR); Kyoung-Han Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/152,206

(22) Filed: May 11, 2016

(30) Foreign Application Priority Data

Dec. 16, 2015 (KR) .................... 10-2015-0179936

(51) Int. Cl.
*H03F 3/45* (2006.01)
*H03F 1/30* (2006.01)

(52) U.S. Cl.
CPC ............ *H03F 1/301* (2013.01); *H03F 3/4521* (2013.01); *H03F 2200/555* (2013.01); *H03F 2203/45212* (2013.01)

(58) Field of Classification Search
CPC  H03F 3/45085; H03F 1/3211; H03F 3/45071; H03F 2203/45702; H03F 3/45089
USPC .................... 327/51–55, 563; 330/9, 253
See application file for complete search history.

(56) References Cited

U.S. PATENT DOCUMENTS

2005/0218986 A1* 10/2005 Garlepp .............. H03F 3/45183
330/259
2014/0312971 A1* 10/2014 Kim .................... H03F 3/45188
330/253

FOREIGN PATENT DOCUMENTS

KR       1020140124553      10/2014

* cited by examiner

*Primary Examiner* — Quan Tra
(74) *Attorney, Agent, or Firm* — IP & T Group LLP

(57) ABSTRACT

Disclosed are a differential amplifier circuit and a semiconductor memory device including the same, wherein the differential amplification circuit includes: a differential amplifier activated in response to an enable signal, capable of differentially amplifying input signals inputted through input terminals and outputting output signals; and an operation control section capable of sequentially applying signals having a voltage difference increasing in stepped fashion to the input terminals of the differential amplifier, measuring voltages of the output signals of the differential amplifier to detect an input offset, and adjusting an activation timing of the enable signal depending on a detected offset.

20 Claims, 12 Drawing Sheets

DIFFERENTIAL AMPLIFIER CIRCUIT AND SEMICONDUCTOR MEMORY DEVICE INCLUDING SAME

CROSS-REFERENCE TO RELATED APPLICATIONS

The present application claims priority of Korean Patent Application No. 10-2015-0179936, filed on Dec. 16, 2015, which is incorporated herein by reference in its entirety.

BACKGROUND

1. Field

Exemplary embodiments of the present invention relate to a semiconductor design technology and, more particularly, to a differential amplifier circuit capable of compensating an offset value between differential input signals.

2. Description of the Related Art

A differential amplifier circuit amplifies a voltage difference between two different input voltages, and is used in almost all types of integrated circuit chips for receiving an external signal or amplifying an internal signal of the chip. For example, a memory device may include several hundred to thousands differential amplifier circuits.

FIG. 1 is a diagram illustrating a conventional differential amplifier circuit 100.

Referring to FIG. 1, the differential amplifier circuit 100 receives an input signal IN and a complementary input signal INB as the input thereof, and amplifies a voltage difference between the input signal IN and the complementary input signal INB to output an output signal OUT and a complementary output signal OUTB. When the voltage of the input signal IN is higher than the voltage of the complementary input signal INB, the differential amplifier circuit 100 outputs the output signal OUT to a high level and outputs the complementary output signal OUTB to a low level. When the voltage of the complementary input signal INB is higher than the voltage of the input signal IN, the differential amplifier circuit 100 outputs the output signal OUT to a low level and outputs the complementary output signal OUTB to a high level. The differential amplifier circuit 100 receives an enable signal EN and performs the amplification operation when the enable signal EN is activated.

In an ideal case, the differential amplifier circuit 100 may amplify the output signal OUT to a high level and the complementary output signal OUTB to a low level even when the input signal IN is slightly higher than the complementary input signal INB. Also, the differential amplifier circuit 100 may amplify the output signal OUT to a low level and the complementary output signal OUTB to a high level even when the complementary input signal INB is slightly higher than the input signal IN.

However, an actual differential amplifier circuit 100 has an inherent offset between the input signal IN and the complementary input signal INB. The inherent offset may be due to a mismatch of a load resistor in the differential amplifier circuit, a mismatch of a W/L ratio of an input transistor pair in the differential amplifier circuit, a mismatch of a threshold voltage of the input transistor pair in the differential amplifier circuit, or the like. Hence, an actual differential amplifier circuit 100 cannot perform a normal amplification operation when the voltage difference between the input signal IN and the complementary input signal INB is smaller than the inherent offset. The inherent offset is also referred to as a sensing threshold value Vth. For example, when the voltage of the input signal IN is higher than the voltage of the complementary input signal INB but the voltage difference therebetween is not greater than the sensing threshold value Vth, the differential amplifier circuit may perform an abnormal amplification operation of outputting the output signal OUT to a low level and outputting the complementary output signal OUTB to a high level.

FIGS. 2A and 2B are views explaining a normal operation and an abnormal operation of the differential amplifier circuit 100 of FIG. 1.

FIG. 2A illustrates the enable signal EN activated to a high level when a voltage difference (ΔV) between the input signal IN and the complementary input signal INB is greater than or equal to the sensing threshold value Vth of the differential amplifier circuit 100. Hence, in this case, the differential amplifier circuit 100 performs a normal amplification operation.

FIG. 2B illustrates the enable signal EN activated to a high level when the voltage difference (ΔV) between the input signal IN and the complementary input signal INB is smaller than the sensing threshold value Vth of the differential amplifier circuit 100. In this case, the differential amplifier circuit 100 determines that there is no voltage difference between the input signal IN and the complementary input signal INB, and thus cannot perform a normal amplification operation.

As described above, a conventional differential amplifier requires a minimum voltage swing for proper normal operation due to an inherent offset which may cause increased power consumption, sensing delays, and may have a negative effect on the overall performance of the amplifier.

Therefore, it may be advantageous to detect the offset, i.e., the sensing threshold value Vth of a differential amplifier circuit in advance, to activate an enable signal EN when a voltage level difference (ΔV) between an input signal IN and a complementary input signal INB is greater than or equal to the detected threshold sensing voltage value Vth, thereby preventing abnormal operation.

SUMMARY

Various embodiments are directed to provide a differential amplifier circuit capable of detecting an input offset of the differential amplifier.

In addition, various embodiments are directed to provide a differential amplifier circuit capable of determining an activation timing of the differential amplifier after detecting the input offset.

In an embodiment, a differential amplification circuit may include: a differential amplifier activated in response to an enable signal, capable of differentially amplifying input signals inputted through input terminals and outputting output signals; and an operation control section capable of sequentially applying signals having a voltage difference increasing in stepped fashion to the input terminals of the differential amplifier, measuring voltages of the output signals of the differential amplifier to detect an input offset, and adjusting an activation timing of the enable signal depending on a detected offset.

In an embodiment, a differential amplification circuit may include: a differential amplifier activated in response to an enable signal, capable of differentially amplifying input signals inputted through input terminals and outputting output signals; an offset controller capable of generating a test enable signal activated in an assigned period, generating step voltages having a voltage difference increasing in stepped fashion when the test enable signal is activated, providing the test enable signal and the step voltages as the inputs signals and an enable signal of the differential amplifier, and measuring voltages of the output signals of the differential amplifier to detect an input offset, during a test mode; and a timing control unit capable of adjusting an activation timing of the enable signal depending on a detected offset during a normal mode.

In an embodiment, a semiconductor memory device may include: a sense amplifier circuit which comprises N number of sense amplifiers which are capable of being activated in response to an enable signal, and sensing and amplifying external input data of a plurality of local line pairs to output output data to a plurality of global line pairs; and an operation control section capable of sequentially applying, during a test mode, signals having a voltage difference increasing in stepped fashion to input terminals of each sense amplifier, measuring voltages of the output data of the sense amplifiers to detect an input offset, and adjusting an activation timing of the enable signal depending on a detected offset.

DETAILED DESCRIPTION

Figure 1:
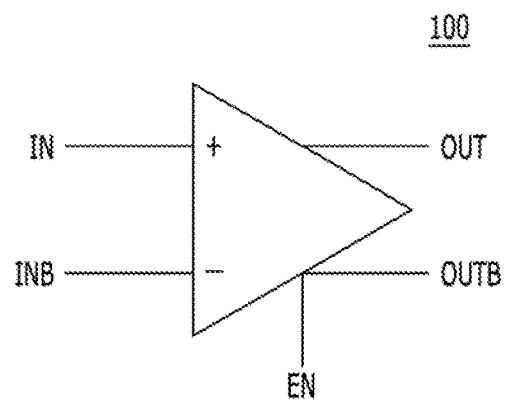
FIG. 1 is a diagram illustrating a conventional differential amplifier circuit.
Figure 2A:
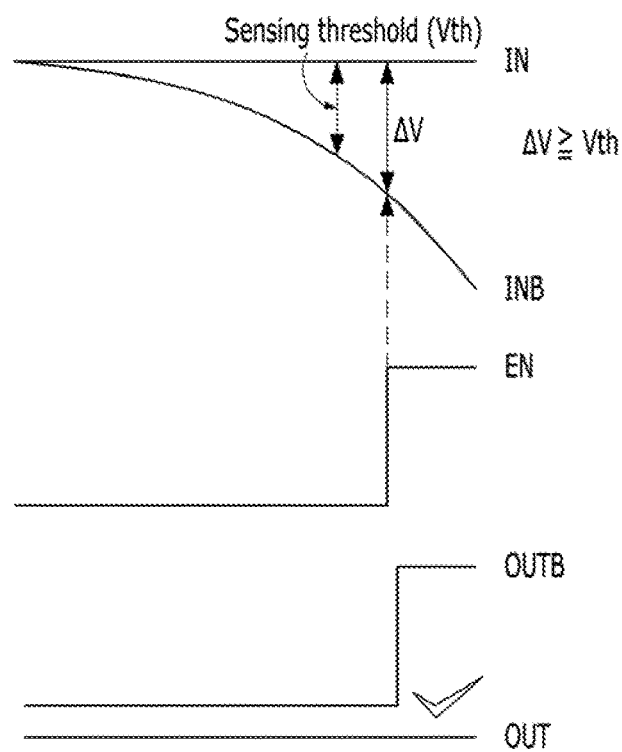
FIGS. 2A and 2B are diagrams illustrating a normal and an abnormal operation of the differential amplifier circuit of FIG. 1, respectively.
Figure 2B:
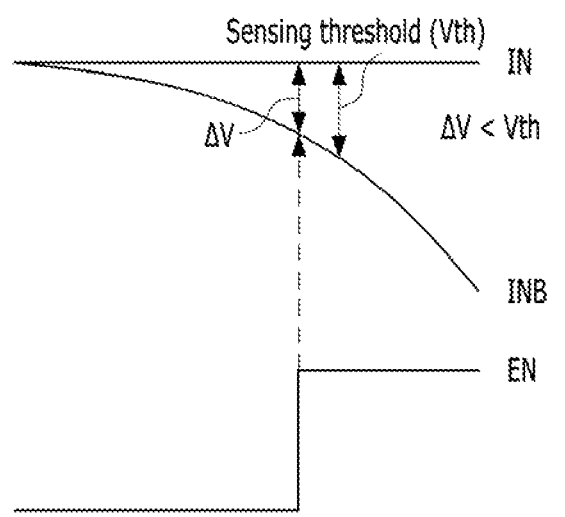
Figure 2B:
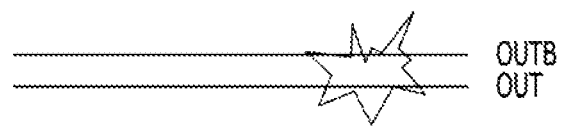

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. In addition, it will also be understood that when an element or layer is referred to as being "between" two elements or layers, it can be the only element or layer between the two elements or layers, or one or more intervening elements or layers may also be present.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

Figure 3:
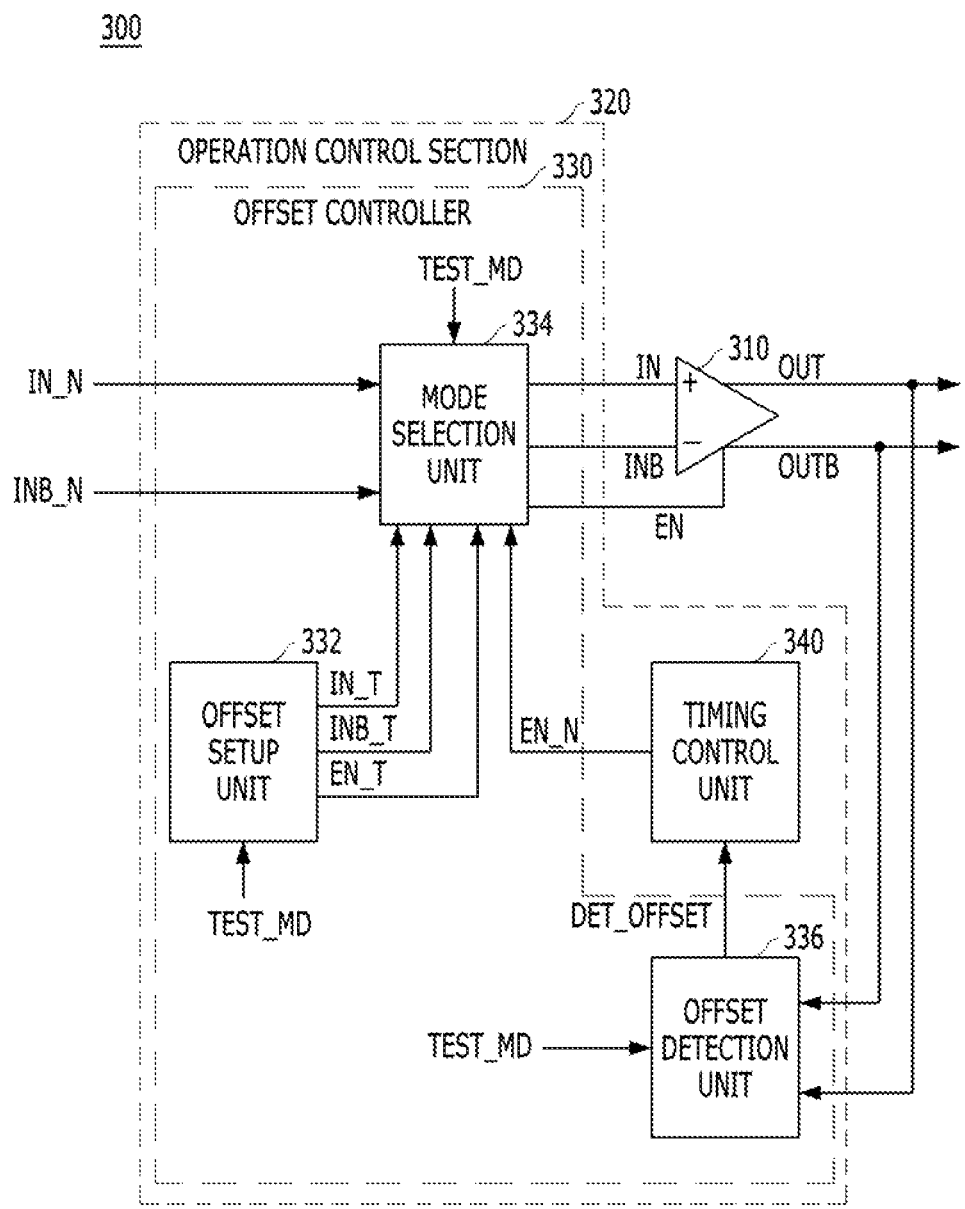
FIG. 3 is a block diagram illustrating a configuration of a differential amplifier circuit, according to an embodiment of the present invention.

Referring now to FIG. 3 a differential amplifier circuit 300 is provided, according to an embodiment of the present invention.

The differential amplifier circuit 300 may include a differential amplifier 310 and an operation control section 320.

The differential amplifier 310 may be activated in response to an enable signal EN, differentially amplify a first input signal IN and a second input signal INB inputted through a positive input terminal (+) and a negative input terminal (−), respectively, and output a first output signal OUT and a second output signal OUTB. The operation control section 320 may sequentially apply a first step voltage IN_T and a second step voltage INB_T, which have a voltage difference (ΔV) increasing in stepped fashion, to the positive input terminal (+) and negative input terminal (−) of the differential amplifier 310, respectively. The operation control section 320 may then measure the voltages of the first output signal OUT and second output signal OUTB of the differential amplifier 310 to detect an Input offset, and adjust an activation timing of the enable signal EN on the basis of the detected offset DET_OFFSET.

More specifically, the operation control section 320 may include an offset controller 330 and a timing control unit 340.

The offset controller 330 may generate a test enable signal EN_T activated with an assigned period during a test mode, generate first and second step voltages IN_T and INB_T which have a voltage difference (ΔV) increasing in stepped fashion whenever the test enable signal EN_T is activated, and provide the test enable signal EN_T and the first and second step voltages IN_T and INB_T as the enable signal EN and the first and second input signals IN and INB of the differential amplifier 310. In addition, the offset controller 330 may measure the voltages of the first and second output signals OUT and OUTB of the differential amplifier 310 to detect the input offset, and output the detected offset DET_OFFSET. The timing control unit 340 may adjust the activation timing of the enable signal EN on the basis of the detected offset DET_OFFSET during a normal mode.

More specifically, the offset controller 330 may include an offset setup unit 332, a mode selection unit 334, and an offset detection unit 336.

The offset setup unit 332 may generate the test enable signal EN_T periodically toggled in response to a test mode signal TEST_MD denoting entry into the test mode, and generate the first and second step voltages IN_T and INB_T having the voltage difference (ΔV) increasing in stepped fashion whenever the test enable signal EN_T is toggled. The mode selection unit 334 may select the first and second step voltages IN_T and INB_T and the test enable signal EN_T in response to the test mode signal TEST_MD during the test mode, select a normal enable signal EN_N and first and second external input signals IN_N and INB_N during the normal mode, and provide the selected signals as the enable signal EN and the first and second input signals IN and INB of the differential amplifier 310. The offset detection unit 336 may measure the voltages of the first and second output signals OUT and OUTB of the differential amplifier 310 to detect the input offset in response to the test mode signal TEST_MD, and output the detected offset DET_OFFSET. In particular, the normal enable signal EN_N may be outputted after the activation timing thereof has been adjusted by the timing control unit 340 on the basis of the detected offset DET_OFFSET outputted from the offset detection unit 336.

As described above, according to an embodiment of the present invention, during a test mode, step voltages having a voltage difference (ΔV) increasing in stepped fashion may be applied to both input terminals of a differential amplifier, an input offset of the differential amplifier may be detected by measuring voltages of outputs signals of the differential amplifier, and then an activation timing of the differential amplifier may be adjusted depending on the detected offset. Therefore, an optimum operation timing of the differential amplifier may be determined to reduce power consumption and to increase a sensing speed.

Hereinafter, the configuration of each component will be described in detail with reference to the accompanying drawings.

Figure 4:
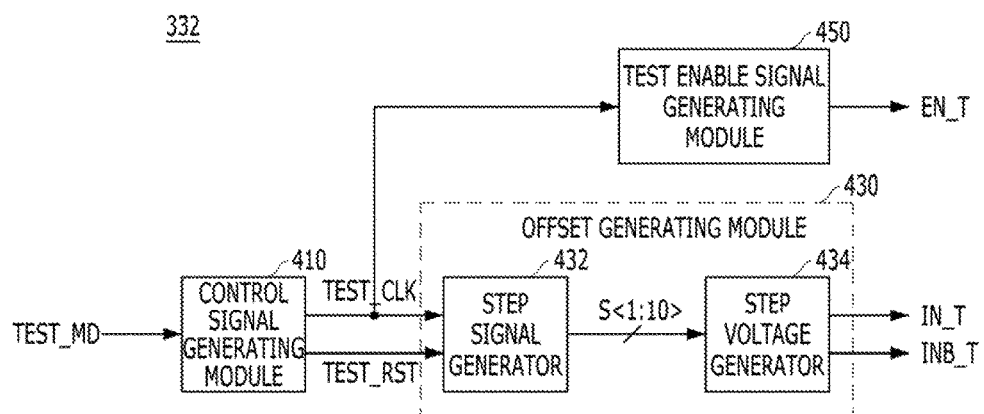
FIG. 4 is a block diagram illustrating an example of a detailed configuration of an offset setup unit of FIG. 3.

Referring now to FIG. 4 a detailed configuration of the offset setup unit 332 of FIG. 3 is provided, according to an embodiment of the invention.

For example, the offset setup unit 332 may include a control signal generating module 410, an offset generating module 430, and a test enable signal generating module 450.

The control signal generating module 410 may generate a test clock signal TEST_CLK periodically toggled in response to the test mode signal TEST_MD. The offset generating module 430 may generate the first and second step voltages IN_T and INB_T having the voltage difference (ΔV) which increases in stepped fashion whenever the test clock signal TEST_CLK is toggled. The test enable signal generating module 450 may delay the test clock signal TEST_CLK by an assigned period of time, and output the test enable signal EN_T. In particular, the test enable signal EN_T becomes periodically toggled similarly to the test clock signal TEST_CLK. Accordingly, the differential amplifier 310 may be periodically activated during the test mode.

More specifically, the offset generating module 430 may include a step signal generator 432 and a step voltage generator 434.

The step signal generator 432 may generate a plurality of step signals S<1:10> sequentially activated in synchronization with the test clock signal TEST_CLK. The step voltage generator 434 may generate the first and second step voltages IN_T and INB_T which have the voltage difference (ΔV) increasing in stepped fashion in response to the plurality of step signals S<1:10>.

Meanwhile, the control signal generating module 410 may generate a test reset signal TEST_RST activated in an assigned period, in response to the test mode signal TEST_MD. The test reset signal TEST_RST may be used to initialize the step signal generator 432.

Figure 5:
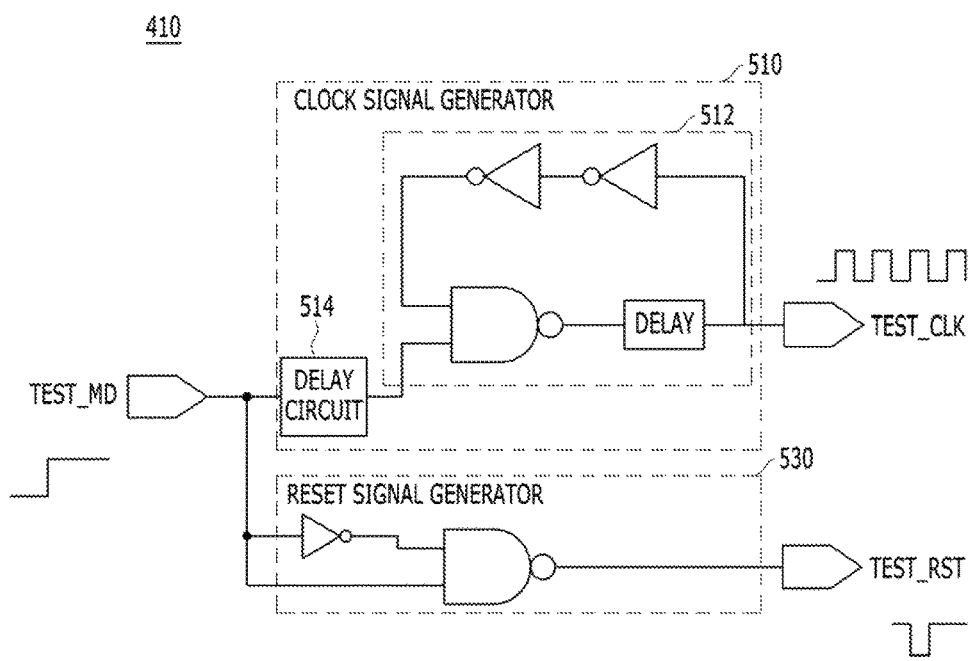
FIG. 5 is a circuit diagram illustrating an example of a detailed configuration of a control signal generating module of FIG. 4.

FIG. 5 is a circuit diagram illustrating the control signal generating module 410 of FIG. 4, according to an embodiment of the invention.

Referring to FIG. 5, the control signal generating module 410 may include a clock signal generator 510 and a reset signal generator 530.

The clock signal generator 510 may generate the test clock signal TEST_CLK periodically toggled in response to the test mode signal TEST_MD. The clock signal generator 510 may be implemented with a ring oscillator 512 operating in response to the test mode signal TEST_MD. The reset signal generator 530 may generate the test reset signal TEST_RST activated in an assigned period, in response to the test mode signal TEST_MD. The reset signal generator 530 may be implemented with a pulse generator.

Meanwhile, in accordance with the embodiment of the present invention, a delay circuit 514 for delaying the test mode signal TEST_MD during an assigned period of time may be included in the clock signal generator 510 so that the test clock signal TEST_CLK outputted from the clock signal generator 510 may be toggled later than an activation timing of the test reset signal TEST_RST outputted from the reset signal generator 530. Accordingly, since the test reset signal TEST_RST may be first activated, a stable circuit operation may be achieved.

Figure 6A:
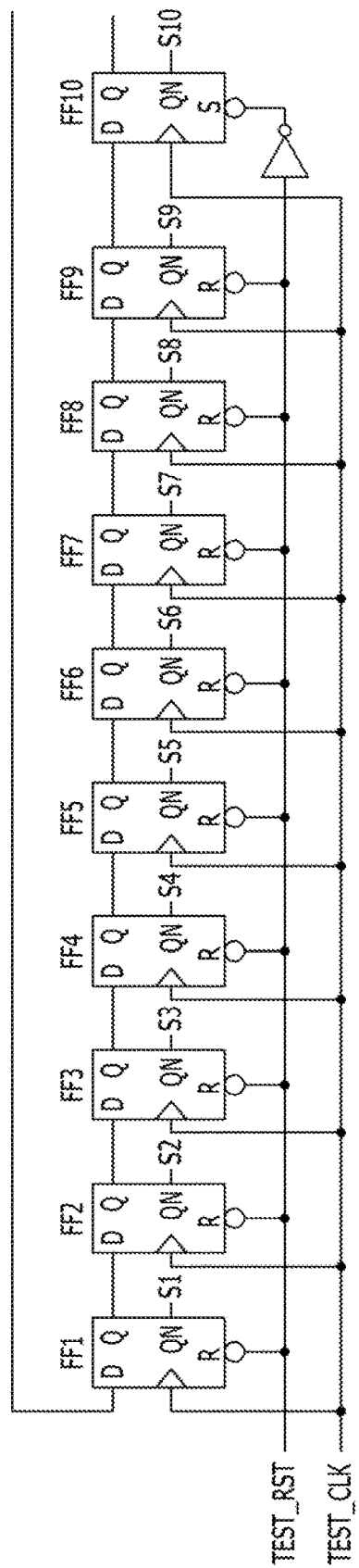
FIGS. 6A and 6B are a circuit diagram and a waveform diagram, respectively, illustrating an example of a detailed configuration of a step signal generator of FIG. 4.
Figure 6B:
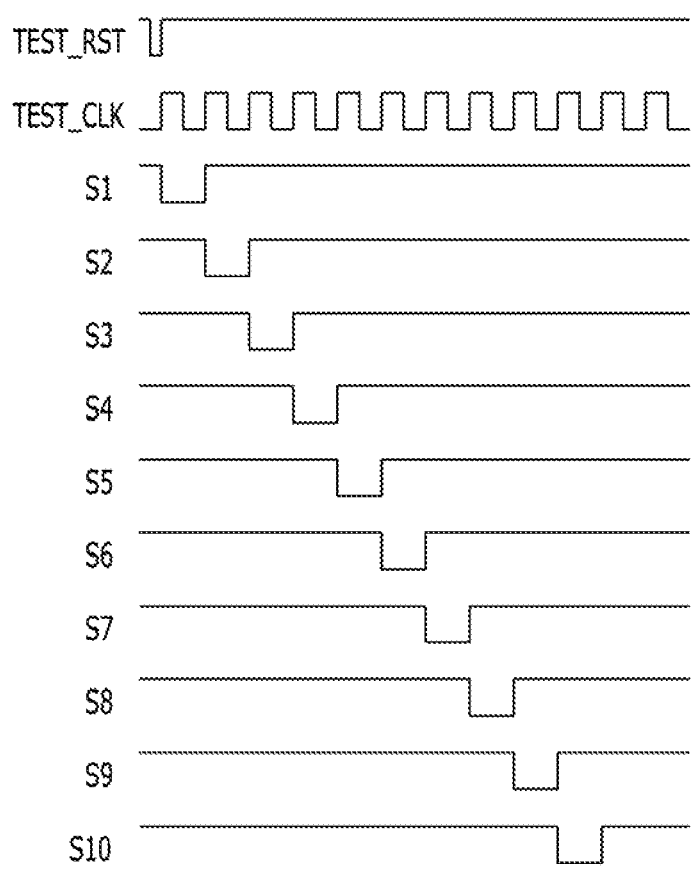

Referring now to FIGS. 6A and 6B, the step signal generator 432 of FIG. 4 will be further described.

Referring to FIG. 6A, the step signal generator 432 may include a plurality of flip-flops FF1 to FF9 coupled in series to each other. The flip-flops FF1 to FF9 may receive the test clock signal TEST_CLK as a clock signal, receive the test reset signal TEST_RST as a reset signal, and output the plurality of step signals S<1:10>. The respective flip-flops FF1 to FF9 may be configured so that each flip-flop receives an output signal Q of its immediately previous stage as an input signal D and may output its own output signal Q to the next stage. Moreover, each flip-flop feeds back an output signal Q of the last-stage, flip-flop FF9 as an input signal D of the first-stage flip-flop FF1.

Referring to FIG. 6B, a plurality of step signals S<1:10> sequentially activated during one period of the test clock signal TEST_CLK after activating the test reset signal TEST_RST may be generated.

Meanwhile, it is noted, that while ten step signals S<1:10> and ten flip-flops FF1 to FF10 are illustrated in the embodiment of FIG. 6A, the invention is not limited in this way and any suitable number of flip-flops may be employed according to design.

Figure 7A:
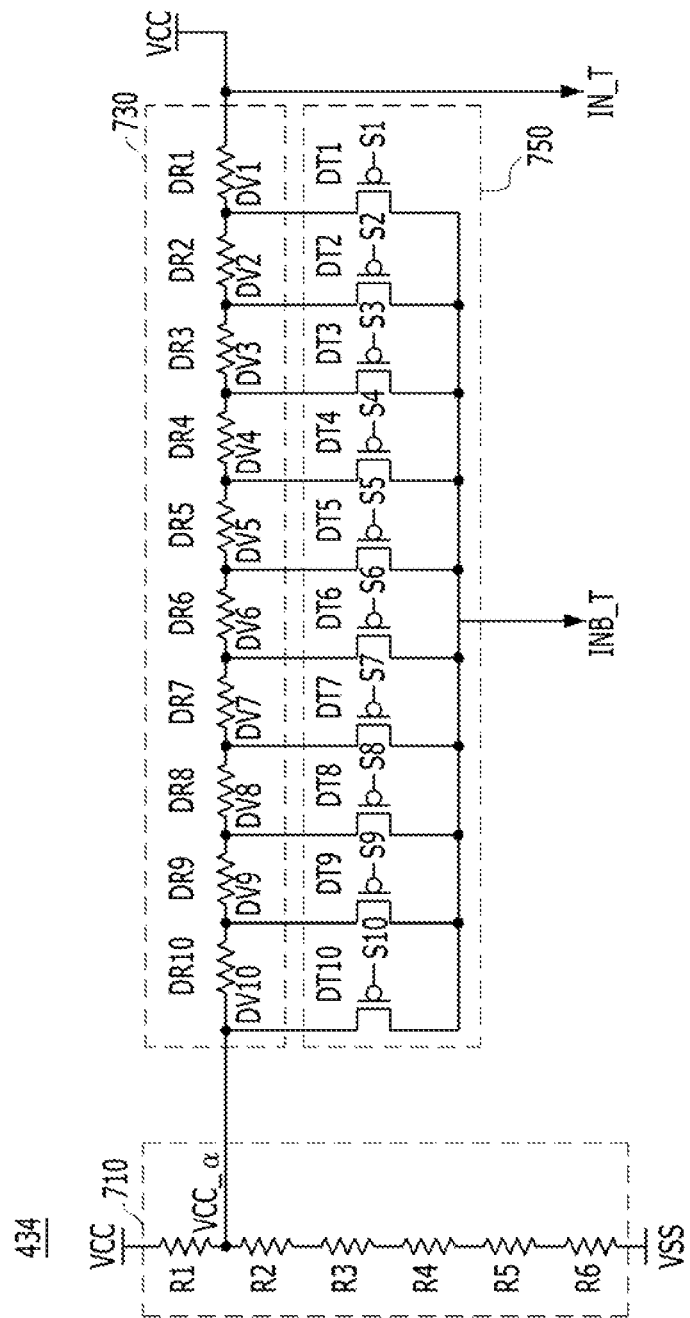
FIGS. 7A and 7B are a circuit diagram and a waveform diagram illustrating an example of a detailed configuration of a step voltage generator of FIG. 4.
Figure 7B:
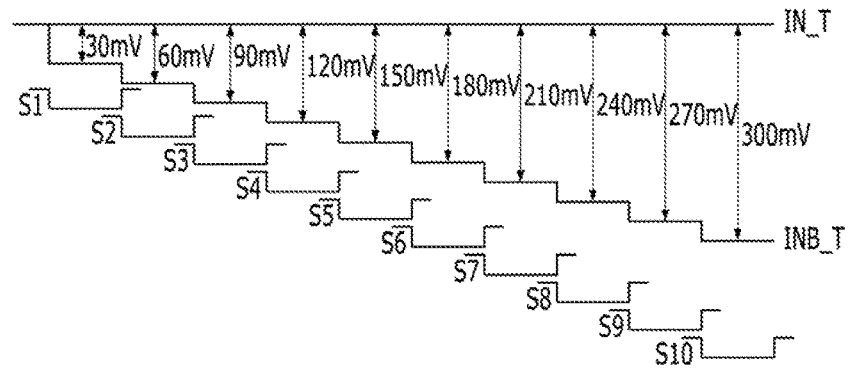

FIGS. 7A and 7B are a circuit diagram and a waveform diagram illustrating a detailed configuration of the step voltage generator 434 of FIG. 4, according to an embodiment of the invention.

Referring to FIG. 7A, the step voltage generator 434 may include a coarse voltage divider 710, a fine voltage divider 730, and an output selector 750.

The coarse voltage divider 710 may coarsely divide a voltage between a power supply voltage VCC and a ground voltage VSS, and output a coarse voltage VCC_α. In accordance with the illustrated embodiment of FIG. 7A, the coarse voltage divider 710 may be implemented with a plurality of first resistors R1 to R6 coupled in series between the power supply voltage VCC and the ground voltage VSS. The plurality of first resistors R1 to R6 may be designed to have an equal resistance. For example, assuming that the power supply voltage VCC is 1.8 V, and six number of first resistors R1 to R6 are coupled in series, the coarse voltage VCC_α may have a voltage level of 0.3 V, i.e., 300 mV.

The fine voltage divider 730 may finely divide a voltage level between the power supply voltage VCC and the coarse voltage VCC_α, and output a plurality of fine voltages DV1 to DV10. In accordance with the illustrated embodiment, the fine voltage divider 730 may be implemented with a plurality (ten) of second resistors DR1 to DR10 coupled in series between the power supply voltage VCC and the coarse voltage VCC_α. The plurality of second resistors DR1 to DR10 may be designed to have an equal resistance. For example, when the power supply voltage VCC is 1.8 V and the coarse voltage VCC_α is 0.3 V, i.e. 300 mV, a voltage difference applied to both terminals of each resistor is 30 mV, and the plurality of fine voltages DV1 to DV10 have voltages dropped in regular sequence from the level of 1.8 V to the level of 30 mV.

The output selector 750 may select one of the plurality of fine voltages DV1 to DV10 in response to the plurality of step signals S<1:10>, and output a second step voltage INB_T. In particular, since the first step voltage IN_T is fixed at the level of the power supply voltage VCC, the first step voltage IN_T and the second step voltage INB_T may be outputted to have a voltage difference (ΔV), i.e., 30 mV, increasing in stepped fashion. In accordance with the embodiment, the output selector 750 may be configured with a plurality of PMOS transistors DT1 to DT10 each of which is coupled between an output terminal of the second step voltage INB_T and an assigned one of the second resistors DR1 to DR10. Each transistor DT1 to DT10 may receive an assigned signal of the plurality of step signals S<1:10> through its respective gat. Therefore, when a specific step signal among the plurality of step signals S<1:10> is activated, an assigned transistor among the plurality of transistors DT1 to DT10 may be turned on, and a fine voltage applied to one terminal of an assigned second resistor among the plurality of second resistors DR1 to DR10 may be outputted as the second step voltage INB_T. For example, when a step signal S2 among the plurality of step signals S<1:10> is activated, a transistor DT2 is turned on, and a fine voltage DV2 applied to one terminal of a second resistor DR2 is outputted as the second step voltage INB_T.

Referring to FIG. 7B, whenever the plurality of step signals S<1:10> are activated in regular sequence, the plurality of type transistors DT1 to DT10 may be sequentially turned on, and the fine voltages DV1 to DV10 applied to the respective terminals of the plurality of second resistors DR1 to DR10 may be sequentially outputted as the second step voltage INB_T. Therefore, the first step voltage IN_T and the second step voltage INB_T having a voltage difference (ΔV), i.e. 30 mV, increasing in stepped fashion may be outputted.

Figure 8:
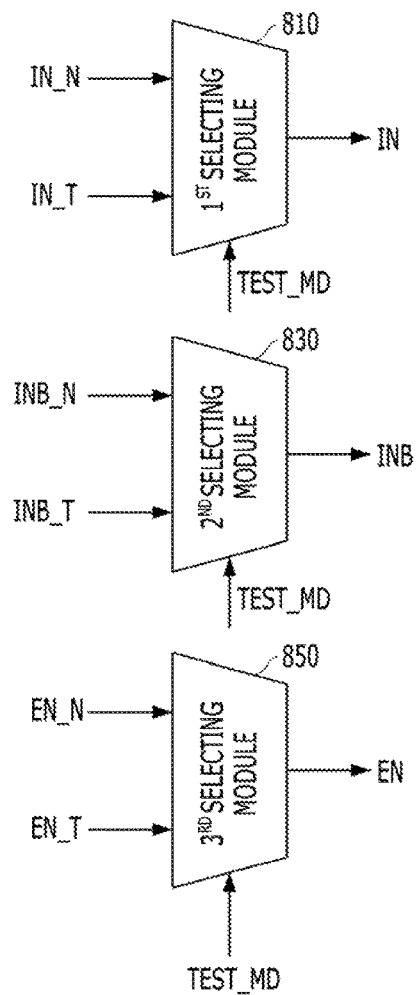
FIG. 8 is a circuit diagram illustrating an example of a detailed configuration of a mode selection unit of FIG. 3.

FIG. 8 is a circuit diagram illustrating a detailed configuration of the mode selection unit 334 of FIG. 3, according to an embodiment of the invention.

Referring to FIG. 8, the mode selection unit 334 may include first to third selecting modules 810, 830 and 850.

The first selecting module 810 may select and output one of the first external input signal IN_N and the first step voltage IN_T as the first input signal IN in response to the test mode signal TEST_MD. The second selecting module 830 may select and output one of the second external input signal INB_N and the second step voltage INB_T as the second input signal INB in response to the test mode signal TEST_MD. The third selecting module 850 may select and output one of the normal enable signal EN_N and the test enable signal EN_T as the enable signal EN in response to the test mode signal TEST_MD.

For example, the mode selection unit 334 may select the first and second step voltages IN_T and INB_T and the test enable signal EN_T during the test mode, select the normal enable signal EN_N and the first and second external input signals IN_N and INB_N inputted from the outside during the normal mode, provide the selected signals as the first and second input signals IN and INB and enable signal EN of the differential amplifier 310.

Figure 9:
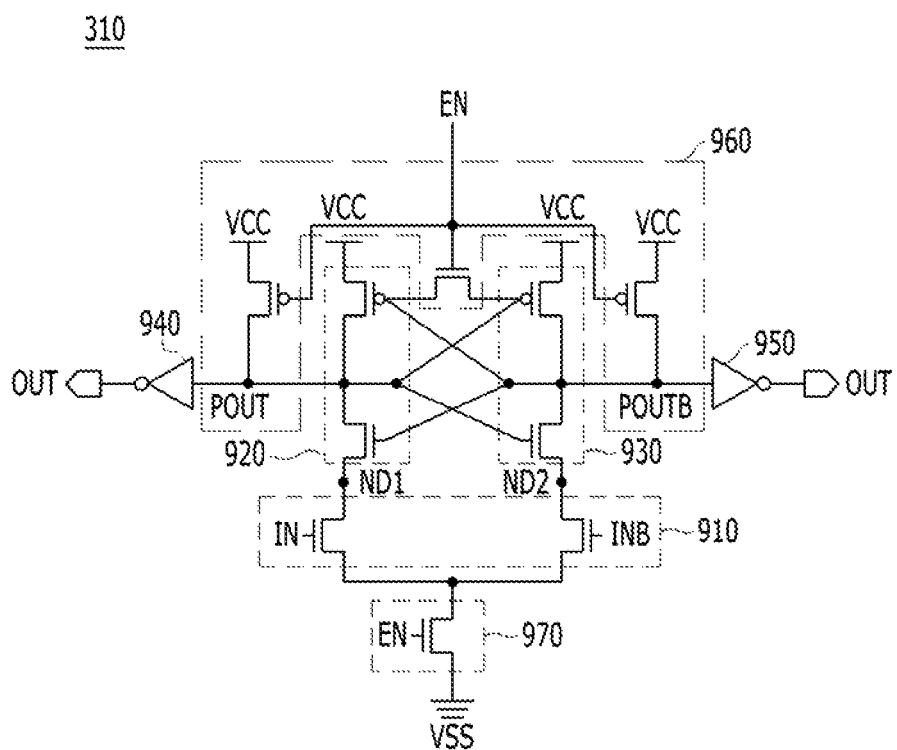
FIG. 9 is a circuit diagram example of the differential amplifier of FIG. 3.

FIG. 9 is a circuit diagram illustrating a detailed configuration of the differential amplifier 310 of FIG. 3, according to an embodiment of the invention.

Referring to FIG. 9, the differential amplifier 310 may include an input unit 910, a first pre-driving unit 920, a second pre-driving unit 930, a first driving unit 940, a second driving unit 950, an initialization unit 960, and an enabling unit 970.

The input unit 910 may receive the first input signal IN and the second input signal INB inputted through the positive input terminal (+) and the negative input terminal (−), respectively. The first pre-driving unit 920 may use the power supply voltage VCC as a pull-up driving voltage, use a voltage of a first node ND1 as a pull-down voltage, and drive a preliminary positive output node POUT in response to a preliminary negative output node POUTB. The second pre-driving unit 930 may use the power supply voltage VCC as a pull-up driving voltage, use a voltage of a second node ND2 as a pull-down voltage, and drive the preliminary negative output node POUTB in response to the preliminary positive output node POUT. The first driving unit 940 may drive a terminal of the first output signal OUT in response to the preliminary positive output node POUT. The second driving unit 950 may drive a terminal of the second output signal OUTB in response to the preliminary negative output node POUTB. The initialization unit 960 may initialize the first and second output signals OUT and OUTB of the differential amplifier 310 when the enable signal EN is inactivated. The enabling unit 970 may supply a bias for the differential amplifier 310 to enable the operation thereof in response to the activation of the enable signal EN.

Hereinafter, an operation of a differential amplifier circuit in accordance with an embodiment of the present invention will be described with reference to the accompanying drawings.

Figure 10:
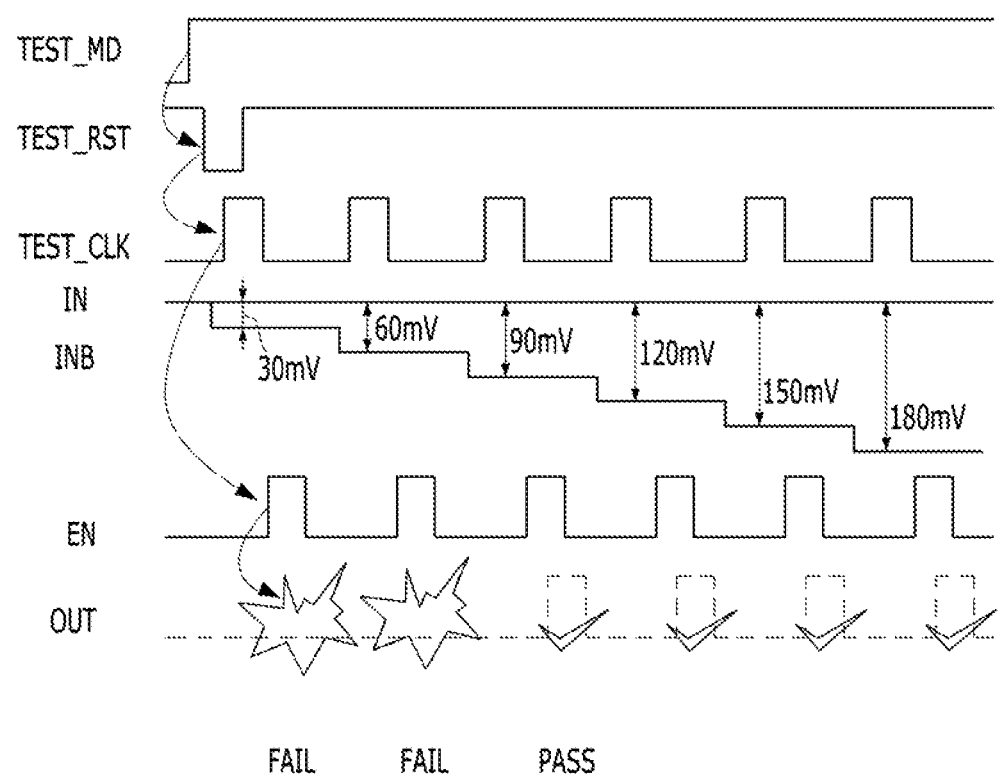
FIG. 10 is a timing diagram illustrating an operation of the differential amplifier circuit of FIGS. 3 to 9.

FIG. 10 is a timing diagram illustrating an operation of the differential amplifier circuit 300 of FIGS. 3 to 9.

Referring to FIG. 10, when the test mode signal TEST_MD denoting entry into the test mode is activated, the control signal generating module 410 of the offset setup unit 332 may generate the test reset signal TEST_RST which is activated to a low level during an assigned period. In addition, the control signal generating module 410 may generate the test clock signal TEST_CLK which is periodically toggled at a time point slightly later than the activation timing of the test reset signal TEST_RST.

The offset generating module 430 of the offset setup unit 332 may generate the first and second step voltages IN_T and INB_T, which have a voltage difference ($\Delta V$) increasing in stepped fashion whenever the test clock signal TEST_CLK is toggled, in response to the test reset signal TEST_RST and the test clock signal TEST_CLK. In addition, the test enable signal generating module 450 of the offset setup unit 332 may delay the test clock signal TEST_CLK during an assigned period, and output the test enable signal EN_T. In this case, since the test mode signal TEST_MD has been activated, the mode selection unit 334 may select the first and second step voltages IN_T and INB_T and the test enable signal EN_T, and provide the selected signals as the first and second input signals IN and INB and the enable signal EN of the differential amplifier 310.

The differential amplifier 310 may be activated in response to the enable signal EN, differentially amplify the first input signal IN and second input signal INB, and output the first output signal OUT and the second output signal OUTB.

The offset detection unit 336 may measure the voltages of the first and second output signals OUT and OUTB of the differential amplifier 310, detect an input offset, and output the detected offset DET_OFFSET, in response to the test mode signal TEST_MD. In this case, when the voltage difference ($\Delta V$) between the first and second step voltages IN_T and INB_T is smaller than a sensing threshold value Vth, the differential amplifier 310 cannot perform a normal amplification operation, so that the voltage of the first output signals OUT cannot have a target level, i.e., a logic high level. Therefore, the offset detection unit 336 may determine a fail when the voltage of the first output signal OUT does not have the target level, determine a pass when the voltage of the first output signal OUT has the target level, and output a voltage difference ($\Delta V$) between the first and second step voltages IN_T and INB_T at a time point, at which a transition occurs from fail to pass, as the detected offset DET_OFFSET. For example, as of FIG. 10, it may be determined to pass when the first output signal OUT becomes a logic high level, and a voltage difference ($\Delta V$), i.e. 90 mV, between the first and second step voltages IN_T and INB_T at a time point at which a transition occurs from fail to pass may be outputted as the detected offset DET_OFFSET.

The timing control unit 340 may adjust the activation timing of the enable signal EN during the normal mode on the basis of the detected offset DET_OFFSET.

As described above, according to an embodiment of the present invention, in a test mode, input voltages having a voltage difference ($\Delta V$) increasing in stepped fashion are applied to the differential amplifier, an output voltage is measured, and then an input offset of the differential amplifier is detected. In a normal mode, the activation timing of the differential amplifier is determined on the basis of the detected offset DET_OFFSET, so that an optimum operation time point can be determined. Accordingly, power consumption of the differential amplifier can be reduced. Also the sensing speed of the differential amplifier can be increased.

Hereinafter, in accordance with an embodiment of the present invention, a semiconductor memory device using a sense amplifier implemented with the differential amplifier will be described.

Figure 11:
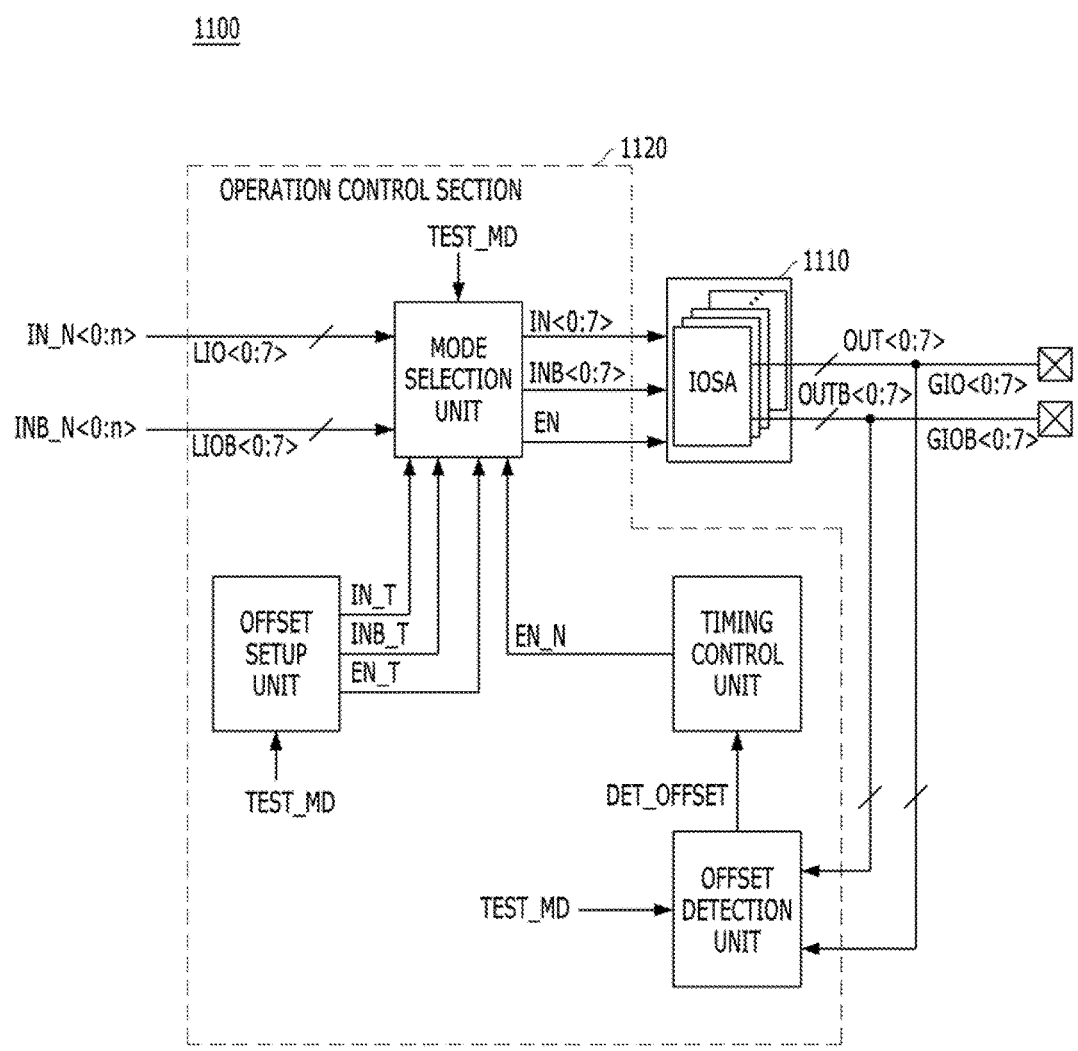
FIG. 11 is a block diagram illustrating a configuration of a semiconductor memory device, according to an embodiment of the present invention.

FIG. 11 is a block diagram illustrating a configuration of a semiconductor memory device 1100, according to an embodiment of the present invention.

The semiconductor memory device 1100 in FIG. 11 mainly illustrates a configuration of the entire memory device, for explaining the characteristics of the memory device in accordance with an embodiment of the present invention, i.e., the configuration for detecting an offset of a sense amplifier circuit and setting an activation timing.

Referring to FIG. 11, the semiconductor memory device 1100 may include an input/output sense amplifier (IOSA) unit 1110 and an operation control section 1120.

The input/output sense amplifier (IOSA) unit 1110 may include a plurality of input/output sense amplifiers IOSAs which are activated in response to an enable signal EN. The input/output sense amplifier (IOSA) unit 1110 may sense and amplify first and second external input data IN_N<0:7> and INB_N<0:7> transferred through local I/O line pairs LIO<0:7> and LIOB<0:7>, and output first and second output data OUT<0:7> and OUTB<0:7> to global I/O line pairs GIO<0:7> and GIOB<0:7>, respectively.

The operation control section 1120 may sequentially apply first and second step voltages IN_T and INB_T having a voltage difference ($\Delta V$) increasing in stepped fashion to the input terminal of each input/output sense amplifier (IOSA) in response to a test mode signal TEST_MD, measure the voltage of an output signal of each input/output sense amplifier (IOSA) to detect an input offset, and adjust an activation timing of the enable signal EN on the basis of a detected offset DET_OFFSET. The operation control section 1120 in FIG. 11 has substantially the same configuration as that of the operation control section 320 in FIG. 3, so a detailed description thereof will be omitted.

Figure 12:
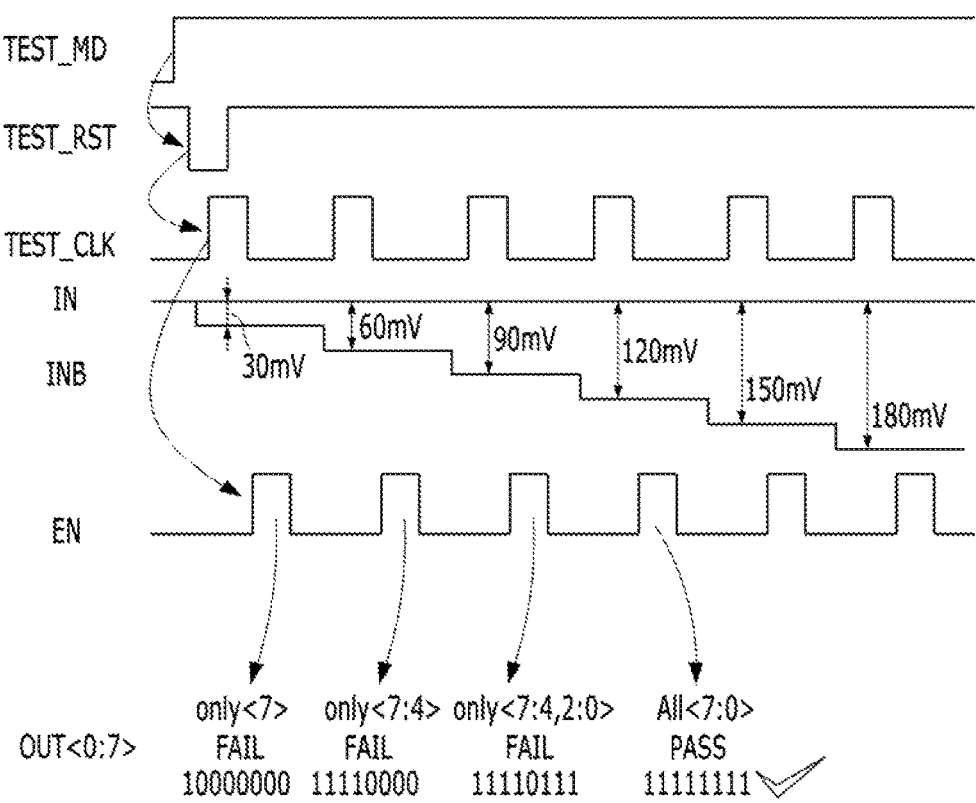
FIG. 12 is a timing diagram illustrating an operation of the semiconductor memory device of FIG. 11, according to an embodiment of the present invention.

FIG. 12 is a timing diagram illustrating an operation of the semiconductor memory device 1100 of FIG. 11.

Referring to FIG. 12, when the test mode signal TEST_MD denoting entry into a test mode is activated, an offset setup unit of the operation control section 1120 may generate a test reset signal TEST_RST which is activated to a low level during an assigned period, and may generate a test clock signal TEST_CLK which is periodically toggled at a time point slightly later than the activation timing of the test reset signal TEST_RST.

The offset setup unit may generate the first and second step voltages IN_T and INB_T, which have a voltage difference ($\Delta V$) increasing in stepped fashion whenever the test clock signal TEST_CLK is toggled, in response to the test reset signal TEST_RST and the test clock signal TEST_CLK. In addition, the offset setup unit may delay the test clock signal TEST_CLK during an assigned period, and output a test enable signal EN_T. In this case, since the test mode signal TEST_MD has been activated, a mode selection unit of the operation control section 1120 may select the first and second step voltages IN_T and INB_T and the test enable signal EN_T, and provide the selected signals as the first and second input data IN<0:7> and INB<0:7> and the enable signals EN of all the input/output sense amplifiers (IOSAs).

The input/output sense amplifiers (IOSAs) may be activated in response to the enable signal EN, sense and amplify the first and second input data IN<0:7> and INB<0:7>, respectively, and output the first and second output data OUT<0:7> and OUTB<0:7>.

An offset detection unit of the operation control section 1120 may measure the voltages of the first and second output data OUT<0:7> and OUTB<0:7> of each input/output sense amplifier (IOSA) to detect an input offset in response to the test mode signal TEST_MD, and output the detected offset DET_OFFSET. In this case, the offset detection unit may determine a fail when at least one of the voltages of the first output data OUT<0:7> of the input/output sense amplifiers (IOSAs) does not have a target level, determine a pass when all the voltages of the first output data OUT<0:7> of the input/output sense amplifiers (IOSAs) have the target level, and output a voltage difference (ΔV) between first and second step voltages IN_T and INB_T at a time point, at which a transition occurs from fail to pass, as the detected offset DET_OFFSET.

For example, as illustrated in FIG. 12, a pass may be determined when all the first output data OUT<0:7> have "11111111", and a voltage difference (ΔV), i.e. 120 mV, between the first and second step voltages IN_T and INB_T at a time point at which a transition occurs from fall to pass may be outputted as the detected offset DET_OFFSET. Meanwhile, although the description is given about a case where a pass is determined when all the first output data OUT<0:7> have "11111111" in accordance with the embodiment, the criterion for determining a pass may vary depending on design options. That is to say, a pass may be determined when N number of first output signals (N<the total number of input/output sense amplifiers (IOSAs) among the first output data OUT<0:7> have a voltage reaching the target level.

A timing control unit of the operation control section 1120 may adjust the activation timing of the enable signal EN during a normal mode on the basis of the detected offset DET_OFFSET.

As described above, in accordance with an embodiment of the present invention, in a semiconductor memory device, an input offset of multiple input/output sense amplifiers (IOSAs) can be detected using a test mode, and the activation timing of the multiple input/output sense amplifiers (IOSAs) can be determined using the detected offset, so that an optimum operation time point can be determined. In this case, the activation timing may be adjusted for a case where all the input/output sense amplifiers (IOSAs) perform a normal amplification operation, or may be adjusted for a case where only a part of the input/output sense amplifiers (IOSAs) perform a normal amplification operation. Accordingly, the power consumption of the differential amplifier can be reduced, and its sensing speed can be increased.

According to the differential amplifier circuit in accordance with an embodiment of the present invention, input voltages having a voltage difference (ΔV) increasing in stepped fashion are applied to a differential amplifier, and then an output voltage is measured to detect an input offset of the differential amplifier, so that a precise offset can be detected.

In addition, according to the differential amplifier circuit in accordance with an embodiment of the present invention, an input offset of the differential amplifier is detected, and the activation timing of the differential amplifier is determined depending on the detected input offset, so that an optimum operation time point can be determined. Accordingly, the power consumption of the differential amplifier can be reduced, and its sensing speed can be increased.

Although various embodiments have been described for illustrative purposes, it will be apparent to those skilled in the art that various changes and modifications may be made without departing from the spirit and or scope of the invention as defined in the following claims.

For example, the positions and types of the logic gates and transistors illustrated in the aforementioned embodiments may vary depending on the polarities of input signals.

What is claimed is:

1. A differential amplification circuit comprising:
   a differential amplifier activated in response to an enable signal, capable of differentially amplifying input signals inputted through input terminals and outputting output signals; and
   an operation control section capable of sequentially applying signals having a voltage difference increasing in stepped fashion to the input terminals of the differential amplifier, measuring voltages of the output signals of the differential amplifier to detect an input offset, and adjusting an activation timing of the enable signal depending on a detected offset.

2. The circuit of claim 1, wherein the operation control section comprises:
   an offset setup unit capable of generating step voltages having a voltage difference increasing in stepped fashion and a first enable signal toggled by periods, during a test mode;
   a mode selection unit capable of selecting the step voltages and the first enable signal during the test mode, selecting external input signals and a second enable signal during a normal mode, and providing the selected signals as the enable signal and the input signals of the differential amplifier;
   an offset detection unit capable of measuring the voltages of the output signals of the differential amplifier to detect the input offset during the test mode; and
   a timing control unit capable of adjusting the activation timing of the second enable signal depending on the detected offset.

3. The circuit of claim 2, wherein the offset setup unit comprises:
   a control signal generating module capable of generating a test clock signal toggled by periods, in response to a test mode signal;
   an offset generating module capable of generating the step voltages when the test clock signal is toggled; and
   a first enable signal generating module capable of delaying the test clock signal during an assigned period of time, and outputting the first enable signal.

4. The circuit of claim 3, wherein the offset generating module comprises:
   a step signal generator capable of generating a plurality of step signals sequentially activated in synchronization with the test clock signal; and
   a step voltage generator capable of generating the step voltages in response to the plurality of step signals.

5. The circuit of claim 4, wherein the step signal generator comprises a plurality of flip-flops capable of being coupled in series to each other and sequentially outputting the step signals in synchronization with the test clock signal,
   wherein each flip-flop is capable of receiving an output signal of a previous stage thereof as an input signal thereof, outputting an output signal thereof as an input signal of a next stage, and feeding back an output signal of a last-stage flip-flop as an input signal of a first-stage flip-flop.

6. The circuit of claim 5, wherein the control signal generating module is capable of generating a test reset signal activated during an assigned period in response to the test mode signal; and the plurality of flip-flops are capable of being reset in response to the test reset signal.

7. The circuit of claim 4, wherein the step voltage generator comprises:

a coarse voltage divider capable of dividing a voltage level between a power supply voltage and a ground voltage, and outputting a coarse voltage;

a fine voltage divider capable of dividing a voltage level between the power supply voltage and the coarse voltage, and outputting a plurality of fine voltages; and an output selector capable of selecting one of the plurality of fine voltages in response to the plurality of step signals, and outputting the step voltages based on the selected fine voltage.

8. The circuit of claim 7, wherein the step voltage generator is capable of outputting the power supply voltage and the selected fine voltage as the step voltages.

9. The circuit of claim 2, wherein the offset detection unit is capable of determining to fail when the voltages of the output signals of the differential amplifier do not have a target level, determining to pass when the voltages of the output signals have the target level, and outputting, as the detected offset, a voltage difference between the step voltages at a time point at which a transition occurs from fail to pass.

10. The circuit of claim 1, wherein the differential amplifier comprises:

an input unit capable of receiving the input signals inputted through the input terminals;

a first pre-driving unit capable of using a power supply voltage as a pull-up driving voltage, using a voltage of a first node as a pull-down driving voltage, and driving a pre-positive output node in response to a pre-negative output node;

a second pre-driving unit capable of using the power supply voltage as a pull-up driving voltage, using a voltage of a second node as a pull-down driving voltage, and driving the pre-negative output node in response to the pre-positive output node;

a driving unit capable of driving output terminals of the output signals in response to the pre-positive output node and the pre-negative output node; and an enabling unit capable of supplying a bias in response to activation of the enable signal.

11. A differential amplification circuit comprising:

a differential amplifier activated in response to an enable signal, capable of differentially amplifying input signals inputted through input terminals and outputting output signals;

an offset controller capable of generating a test enable signal activated in an assigned period, generating step voltages having a voltage difference increasing in stepped fashion when the test enable signal is activated, providing the test enable signal and the step voltages as the inputs signals and an enable signal of the differential amplifier, and measuring voltages of the output signals of the differential amplifier to detect an input offset, during a test mode; and a timing control unit capable of adjusting an activation timing of the enable signal depending on a detected offset during a normal mode.

12. The circuit of claim 11, wherein the offset controller comprises:

an offset setup unit capable of generating a test clock signal toggled by periods during the test mode, and generating the step voltages and the test enable signal depending thereon; and an offset detection unit capable of measuring the voltages of the output signals of the differential amplifier to detect the input offset during the test mode.

13. The circuit of claim 12, wherein the offset setup unit comprises:

a control signal generating module capable of generating a test reset signal activated during an assigned period and the test clock signal toggled by periods, in response to a test mode signal;

a step signal generator capable of generating a plurality of step signals sequentially activated in synchronization with the test clock signal;

a step voltage generator capable of generating the step voltages in response to the plurality of step signals; and a test enable signal generating module capable of delaying the test clock signal during an assigned period of time, and outputting the test enable signal.

14. The circuit of claim 13, wherein the control signal generating module comprises:

a ring oscillator capable of generating the test clock signal toggled by periods in response to the test mode signal; and a pulse generator capable of generating the test reset signal activated during the assigned period in response to the test mode signal, wherein the test reset signal is capable of being activated prior to the test clock signal.

15. The circuit of claim 13, wherein the step signal generator comprises a plurality of flip-flops which are capable of being coupled in series to each other, being reset depending on the test reset signal, and sequentially outputting the step signals in synchronization with the test clock signal, wherein each flip-flop is capable of receiving an output signal of a previous stage thereof as an input signal thereof, outputting an output signal thereof as an input signal of a next stage, and feeding back an output signal of a last-stage flip-flop as an input signal of a first-stage flip-flop.

16. The circuit of claim 13, wherein the step voltage generator comprises:

a coarse voltage divider capable of dividing a voltage level between a power supply voltage and a ground voltage and outputting a coarse voltage;

a fine voltage divider capable of dividing a voltage level between the power supply voltage and the coarse voltage, and outputting a plurality of fine voltages; and an output selector capable of selecting one of the plurality of fine voltages in response to the plurality of step signals, and outputting the step voltages based on the selected fine voltage.

17. The circuit of claim 12, wherein the offset detection unit is capable of determining to fail when the voltages of the output signals of the differential amplifier do not have a target level, determining to pass when the voltages of the output signals have the target level, and outputting, as the detected offset, a voltage difference between the step voltages at a time point at which a transition occurs from fail to pass.

18. A semiconductor memory device comprising:
- a sense amplifier circuit which comprises N number of sense amplifiers which are capable of being activated in response to an enable signal, and sensing and amplifying external input data of a plurality of local line pairs to output output data to a plurality of global line pairs; and
- an operation control section capable of sequentially applying, during a test mode, signals having a voltage difference increasing in stepped fashion to input terminals of each sense amplifier, measuring voltages of the output data of the sense amplifiers to detect an input offset, and adjusting an activation timing of the enable signal depending on a detected offset.

19. The device of claim 18, wherein the operation control section comprises:
- an offset setup unit capable of generating step voltages having a voltage difference increasing in stepped fashion and a test enable signal toggled by periods, during the test mode;
- a mode selection unit capable of selecting the step voltages and the test enable signal during the test mode, selecting a normal enable signal and the external input data of the local line pairs during a normal mode, and providing the selected signals as the enable signal and input signals of each sense amplifier;
- an offset detection unit capable of measuring the voltages of the output data of the sense amplifiers to detect the input offset during the test mode; and
- a timing control unit capable of adjusting the activation timing of the normal enable signal depending on the detected offset.

20. The device of claim 19, wherein the offset detection unit is capable of determining to fail when the voltages of the output data of each sense amplifier do not have a target level, determining to pass when the voltages of the output data have the target level, and outputting, as the detected offset, a voltage difference between the step voltages at a time point at which the number of sense amplifiers in a pass state is greater than an assigned number.

* * * * *